(12) United States Patent
Tsukamoto

(10) Patent No.: US 12,063,024 B2
(45) Date of Patent: Aug. 13, 2024

(54) LC CIRCUIT AND FILTER

(71) Applicant: TDK CORPORATION, Tokyo (JP)

(72) Inventor: Kazuhiro Tsukamoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/896,464

(22) Filed: Aug. 26, 2022

(65) Prior Publication Data

US 2023/0074751 A1 Mar. 9, 2023

(30) Foreign Application Priority Data

Sep. 9, 2021 (JP) .................................. 2021-146932

(51) Int. Cl.
*H03H 7/01* (2006.01)

(52) U.S. Cl.
CPC ........ *H03H 7/0115* (2013.01); *H03H 7/0138* (2013.01); *H03H 7/0161* (2013.01); *H03H 7/1766* (2013.01)

(58) Field of Classification Search
CPC .................... H03H 2001/0085; H03H 7/0115
USPC .................................................. 333/175, 185
See application file for complete search history.

(56) References Cited

U.S. PATENT DOCUMENTS

| 2018/0269846 A1 | 9/2018 | Mizoguchi |
| 2022/0077835 A1 | 3/2022 | Motoyama et al. |
| 2022/0246343 A1* | 8/2022 | Mori .................... H03H 7/1766 |

FOREIGN PATENT DOCUMENTS

TW          2021/07842 A     2/2021

* cited by examiner

*Primary Examiner* — Rakesh B Patel
(74) *Attorney, Agent, or Firm* — Oliff PLC

(57) ABSTRACT

An LC circuit includes a first capacitor provided between a first connection point and a second connection point, a second capacitor provided between the second connection point and a third connection point, a third capacitor provided between the third connection point and a fourth connection point, a fourth capacitor provided between the first connection point and the third connection point, a fifth capacitor provided between the second connection point and the fourth connection point, a first inductor connected to the second connection point, and a second inductor connected to the third connection point.

23 Claims, 17 Drawing Sheets

LC CIRCUIT AND FILTER

BACKGROUND OF THE INVENTION

1. Field of the Invention

The present invention relates to an LC circuit and a filter each including a plurality of capacitors.

2. Description of the Related Art

Compact mobile communication apparatuses are generally configured to use a single common antenna for a plurality of applications that use different systems and have different service frequency bands, and to use a branching filter to separate a plurality of signals received and transmitted by the antenna from each other.

A branching filter for separating a first signal of a frequency within a first frequency band and a second signal of a frequency within a second frequency band higher than the first frequency band from each other typically includes a common port, a first signal port, a second signal port, a first filter provided in a first signal path leading from the common port to the first signal port, and a second filter provided in a second signal path leading from the common port to the second signal port. As the first and second filters, LC resonators including inductors and capacitors are used, for example. A branching filter including first and second filters as described above is disclosed in U.S. Patent Application Publication No. 2018/0269846A1.

The recent market demands for reductions in size and footprint of the compact mobile communication apparatuses have also required miniaturization of branching filters for use in those communication apparatuses. In designing of a branching filter, the order of a filter is increased in some cases to satisfy a desired characteristic. Accordingly, the number of capacitors included in the filter increases as well. For example, in the branching filter disclosed in U.S. Patent Application Publication No. 2018/0269846A1, a high-pass filter includes five capacitors connected in series. Conventionally, it has been difficult to miniaturize a high-pass filter while satisfying a desired characteristic.

The above-described problem is not limited to a high-pass filter of a branching filter but generally applies to an LC circuit and a filter each including a plurality of capacitors.

SUMMARY OF THE INVENTION

An objective of the present invention is to provide an LC circuit and a filter each including a plurality of capacitors and that can be miniaturized with a desired characteristic satisfied.

An LC circuit of the present invention includes a first capacitor provided between a first connection point and a second connection point, a second capacitor provided between the second connection point and a third connection point, a third capacitor provided between the third connection point and a fourth connection point, a fourth capacitor provided between the first connection point and the third connection point, a fifth capacitor provided between the second connection point and the fourth connection point, a first inductor connected to the second connection point, and a second inductor connected to the third connection point.

In the LC circuit of the present invention, the first inductor may be provided between the second connection point and ground. The second inductor may be provided between the third connection point and the ground. In this case, the LC circuit of the present invention further may include a third inductor provided between each of the first inductor and the second inductor and the ground.

The LC circuit of the present invention may further include a sixth capacitor connected to the second connection point and connected in parallel to the first inductor, and a seventh capacitor connected to the third connection point and connected in parallel to the second inductor.

In the LC circuit of the present invention, the first connection point may be connected to a first signal port for signal inputting or outputting. The fourth connection point may be connected to a second signal port for signal inputting or outputting. In this case, the first to fourth connection points may be sequentially provided on a signal path connecting the first signal port and the second signal port. In this case, another circuit may be provided at least one of between the first connection point and the first signal port or between the fourth connection point and the second signal port.

The LC circuit of the present invention may further include a stack for integrating the first to fifth capacitors and the first and second inductors, the stack including a plurality of dielectric layers and conductor layers that are stacked. In this case, the plurality of conductor layers may include a plurality of capacitor conductor layers for constituting the first to fifth capacitors and a plurality of inductor conductor layers for constituting the first and second inductors. The plurality of capacitor conductor layers may include two capacitor conductor layers disposed at the same position in a stacking direction of the plurality of dielectric layers. The two capacitor conductor layers may be point symmetric to each other. The plurality of inductor conductor layers may include two inductor conductor layers disposed at the same position in the stacking direction of the plurality of dielectric layers. The two inductor conductor layers may be point symmetric to each other.

A filter of the present invention includes a first signal port and a second signal port each used for signal inputting or outputting, a signal path that connects the first signal port and the second signal port and on which a first connection point, a second connection point, a third connection point, and a fourth connection point are sequentially provided, a first capacitor provided between the second connection point and the third connection point, a second capacitor provided between the first connection point and the third connection point, a third capacitor provided between the second connection point and the fourth connection point, a first inductor connected to the second connection point, and a second inductor connected to the third connection point.

In the filter of the present invention, the first inductor may be provided between the second connection point and ground. The second inductor may be provided between the third connection point and the ground. In this case, the filter of the present invention may further include a third inductor provided between each of the first inductor and the second inductor and the ground.

The filter of the present invention may further include a fourth capacitor provided between the first connection point and the second connection point, and a fifth capacitor provided between the third connection point and the fourth connection point. In this case, the first to fifth capacitors and the first and second inductors may constitute a high-pass filter.

When the filter of the present invention includes the fourth capacitor and the fifth capacitor, another circuit may be provided at least one of between the first connection point and the first signal port or between the fourth connection point and the second signal port. In this case, the first to fifth capacitors and the first and second inductors may constitute a high-pass filter. The other circuit may be a low-pass filter.

The filter of the present invention may further include a sixth capacitor connected to the second connection point and connected in parallel to the first inductor, and a seventh capacitor connected to the third connection point and connected in parallel to the second inductor.

The filter of the present invention may further include a stack for integrating the first to third capacitors and the first and second inductors, the stack including a plurality of dielectric layers and conductor layers that are stacked. In this case, the plurality of conductor layers may include a plurality of capacitor conductor layers for constituting the first to third capacitors and a plurality of inductor conductor layers for constituting the first and second inductors. The plurality of capacitor conductor layers may include two capacitor conductor layers disposed at the same position in a stacking direction of the plurality of dielectric layers. The two capacitor conductor layers may be point symmetric to each other. The plurality of inductor conductor layers may include two inductor conductor layers disposed at the same position in the stacking direction of the plurality of dielectric layers. The two inductor conductor layers may be point symmetric to each other.

The LC circuit of the present invention includes the first to fifth capacitors and the first and second inductors connected as described above. Thus, according to the present invention, it is possible to achieve an LC circuit that can be miniaturized with a desired characteristic satisfied.

The filter of the present invention includes the first to third capacitors and the first and second inductors connected as described above. Thus, according to the present invention, it is possible to achieve a filter that can be miniaturized with a desired characteristic satisfied.

Other and further objects, features and advantages of the present invention will appear more fully from the following description.

DETAILED DESCRIPTION OF THE PREFERRED EMBODIMENTS

First Embodiment

Figure 1:
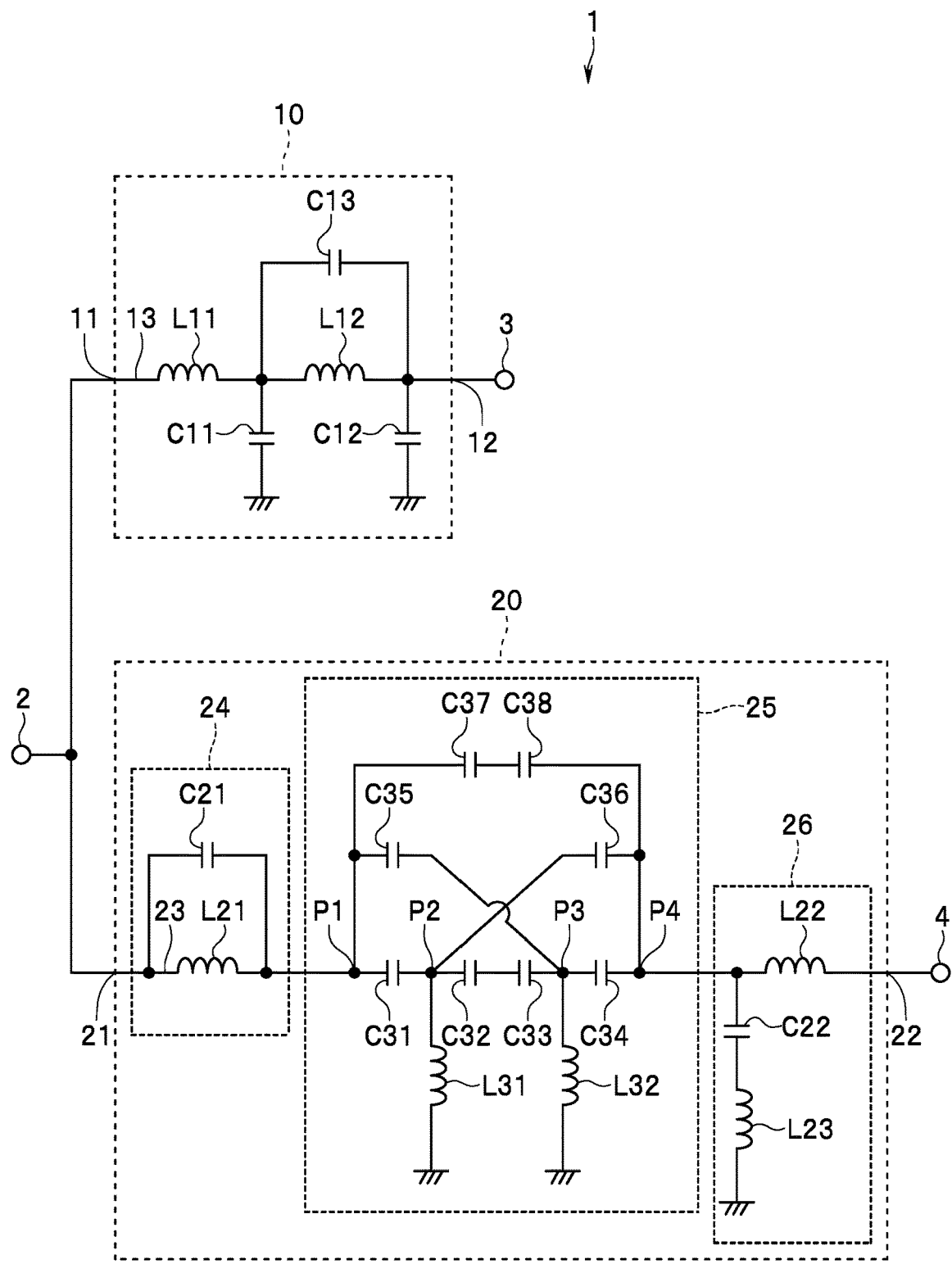
FIG. 1 is a circuit diagram showing a circuit configuration of a branching filter of a first embodiment of the invention.

Preferred embodiments of the present invention will now be described in detail with reference to the drawings. First, the configuration of a branching filter 1 of the first embodiment of the invention will be outlined with reference to FIG. 1. The branching filter 1 in the present embodiment is a diplexer and includes an LC circuit of the present embodiment and a filter of the present embodiment. The branching filter 1 includes a first filter 10 that selectively passes a first signal of a frequency within a first passband, and a second filter 20 that selectively passes a second signal of a frequency within a second passband higher than the first passband.

The branching filter 1 further includes a common port 2, a signal port 3, and a signal port 4. In the circuit configuration, the first filter 10 is provided between the common port 2 and the signal port 3, and the second filter 20 is provided between the common port 2 and the signal port 4. In the present application, the expression of "in the (a) circuit configuration" is used to indicate not layout in physical configuration but layout in the circuit diagram.

The first signal selectively passes through a signal path provided with the first filter 10 and connecting the common port 2 and the signal port 3. The second signal selectively passes through a signal path provided with the second filter 20 and connecting the common port 2 and the signal port 4. In such a manner, the branching filter 1 separates the first signal and the second signal.

Next, an example of the first and second filters 10 and 20 will be described with reference to FIG. 1. A configuration of the first filter 10 will initially be described. The first filter 10 includes a first signal port 11 connected to the common port 2, a second signal port 12 connected to the signal port 3, a signal path 13 connecting the first and second signal ports 11 and 12, inductors L11 and L12, and capacitors C11, C12, and C13. The first and second signal ports 11 and 12 are each used for signal inputting or outputting to the first filter 10. The signal path 13 is a part of a signal path connecting the common port 2 and the signal port 3.

The inductors L11 and L12 and the capacitors C11 to C13 constitute a low-pass filter. The inductors L11 and L12 are provided on the signal path 13 in the circuit configuration. One end of the inductor L11 is connected to the first signal port 11. The other end of the inductor L11 is connected to one end of the inductor L12. The other end of the inductor L12 is connected to the second signal port 12.

One end of the capacitor C11 is connected to a connection point between the inductor L11 and the inductor L12. One end of the capacitor C12 is connected to the other end of the inductor L12. The other ends of the capacitors C11 and C12 are connected to the ground. The capacitor C13 is connected in parallel with the inductor L12.

Next, the configuration of the second filter 20 will be described. The second filter 20 includes at least an LC circuit 25. The LC circuit 25 corresponds to the LC circuit according to the present embodiment. The second filter 20 corresponds to the filter according to the present embodiment.

The second filter 20 further includes a first signal port 21 connected to the common port 2, a second signal port 22 connected to the signal port 4, a signal path 23 connecting the first signal port 21 and the second signal port 22, and LC circuits 24, 25, and 26. The first and second signal ports 21 and 22 are each used for signal inputting or outputting to the second filter 20. The signal path 23 is a part of a signal path connecting the common port 2 and the signal port 4.

The LC circuit 24 includes an inductor L21 and a capacitor C21. The inductor L21 and the capacitor C21 constitute a low-pass filter. One end of the inductor L21 is connected to the first signal port 21. The capacitor C21 is connected in parallel with the inductor L21.

The LC circuit 25 includes inductors L31 and L32, and capacitors C31, C32, C33, C34, C35, C36, C37, and C38. The inductors L31 and L32 and the capacitors C31 to C38 constitute a high-pass filter.

As shown in FIG. 1, four connection points provided on the signal path 23 are referred to as a first connection point P1, a second connection point P2, a third connection point P3, and a fourth connection point P4, sequentially from the first signal port 21 side. Each connection point is connected to two or more of a plurality of constituent components included in the circuit. Specifically, the plurality of constituent components are inductors and capacitors. Two or more constituent components connected to a connection point are different from two or more constituent components connected to another connection point.

The first connection point P1 is connected to the other end of the inductor L21 of the LC circuit 24. The first connection point P1 is also connected to the first signal port 21 through the LC circuit 24. The fourth connection point P4 is connected to the second signal port 22 through the LC circuit 26.

The capacitor C31 is provided between the first connection point P1 and the second connection point P2. The capacitors C32 and C33 are provided between the second connection point P2 and the third connection point P3. The capacitor C34 is provided between the third connection point P3 and the fourth connection point P4. The capacitor C35 is provided between the first connection point P1 and the third connection point P3. The capacitor C36 is provided between the second connection point P2 and the fourth connection point P4. The capacitors C37 and C38 are provided between the first connection point P1 and the fourth connection point P4.

In the present embodiment, in particular, one end of the capacitor C32 is connected to the second connection point P2. One end of the capacitor C33 is connected to the third connection point P3. The other ends of the capacitors C32 and C33 are connected to each other.

In the present embodiment, in particular, one end of the capacitor C37 is connected to the first connection point P1. One end of the capacitor C38 is connected to the fourth connection point P4. The other ends of the capacitors C37 and C38 are connected to each other.

The inductor L31 is provided between the second connection point P2 and the ground. The inductor L32 is provided between the third connection point P3 and the ground. In the present embodiment, one end of the inductor L31 is connected to the second connection point P2. One end of the inductor L32 is connected to the third connection point P3. The other ends of the inductors L31 and L32 are connected to the ground.

As shown in FIG. 1, the circuit configuration of the LC circuit 25 is symmetric with respect to a connection point of the capacitors C32 and C33. The capacitance of the capacitor C31 and the capacitance of the capacitor C34 may be equal or substantially equal to each other. Similarly, the capacitance of the capacitor C35 and the capacitance of the capacitor C36 may be equal or substantially equal to each other.

The LC circuit 26 includes inductors L22 and L22, and a capacitor C22. The inductors L22 and L23 and the capacitor C22 constitute a low-pass filter. One end of the inductor L22 is connected to the connection point P4 of the LC circuit 25. The other end of the inductor L22 is connected to the second signal port 22. One end of the capacitor C22 is connected to the one end of the inductor L22. The other end of the capacitor C22 is connected to the one end of the inductor L23. The other end of the inductor L23 is connected to the ground.

The LC circuit 24 (low-pass filter), the LC circuit 25 (high-pass filter), and the LC circuit 26 (low-pass filter) are designed such that the second filter 20 functions as a band-pass filter.

Figure 2:
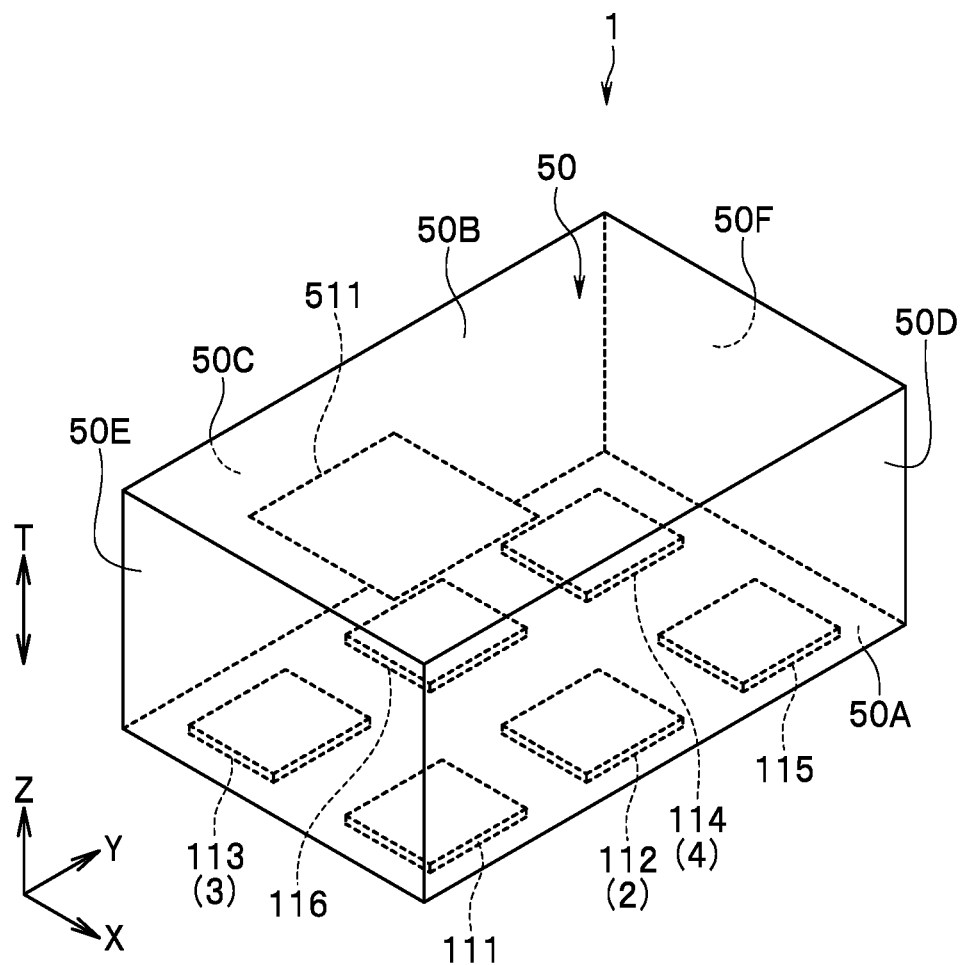
FIG. 2 is an external perspective view showing the branching filter of the first embodiment of the invention.

Next, other configurations of the branching filter 1 will be described with reference to FIG. 2. FIG. 2 is an external perspective view showing of the branching filter 1.

The branching filter 1 further includes a stack 50 for integrating the inductors L11, L12, L21 to L23, L31, and L32 and the capacitors C11 to C13, C21, C22, and C31 to C38, the stack 50 including a plurality of dielectric layers and conductor layers that are stacked. The first filter 10 and the second filter 20 are each constituted by using the plurality of conductor layers.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the top surface 50B and the bottom surface 50A.

Here, X, Y, and Z directions are defined as shown in FIG. 2. The X, Y, and Z directions are orthogonal to one another.

In the present embodiment, a direction parallel to the stacking direction T will be referred to as the Z direction. The opposite directions to the X, Y, and Z directions are defined as −X, −Y, and −Z directions, respectively.

As shown in FIG. 2, the bottom surface 50A is located at the end of the stack 50 in the —Z direction. The top surface 50B is located at the end of the stack 50 in the Z direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The branching filter 1 further include terminals 111, 112, 113, 114, 115, and 116 located at the bottom surface 50A of the stack 50. The terminals 111, 112, and 115 are arranged in this order in the Y direction at positions closer to the side surface 50D than to the side surface 50C. The terminals 113, 116, and 114 are arranged in this order in the Y direction at positions closer to the side surface 50C than to the side surface 50D.

The terminal 112 corresponds to the common port 2, the terminal 113 to the signal port 3, and the terminal 114 to the signal port 4. The common port 2 and the signal ports 3 and 4 are thus located at the bottom surface 50A of the stack 50. Each of the terminals 111, 115 and 116 is connected to the ground.

Next, an example of the plurality of dielectric layers and the plurality of conductor layers constituting the stack 50 will be described with reference to FIG. 3A to FIG. 12. In this example, the stack 50 includes twenty-eight dielectric layers stacked together. The twenty-eight dielectric layers will be referred to as a first to a twenty-eighth dielectric layer in the order from top to bottom. The first to twenty-eighth dielectric layers are denoted by reference numerals 51 to 78, respectively.

In FIG. 3C to FIG. 12, each circle represents a through hole. Each of the dielectric layers 53 to 78 has a plurality of through holes. The through holes are each formed by filling a hole intended for a through hole with a conductive paste. Each of the through holes is connected to a conductor layer or another through hole.

Figure 3A:
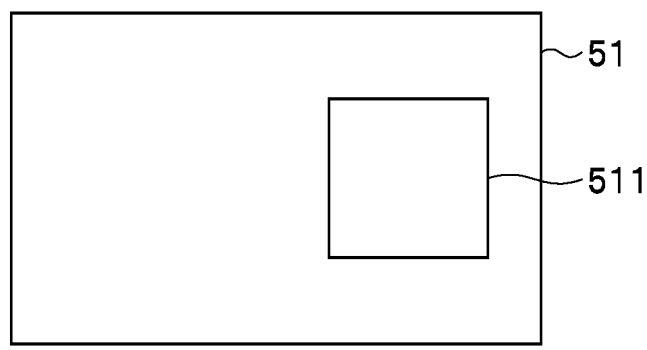
FIG. 3A to FIG. 3C are explanatory diagrams showing respective patterned surfaces of first to third dielectric layers of a stack of the branching filter of the first embodiment of the invention.

FIG. 3A shows the patterned surface of the first dielectric layer 51. A mark 511 made of a conductor layer is formed on the patterned surface of the dielectric layer 51.

Figure 3B:
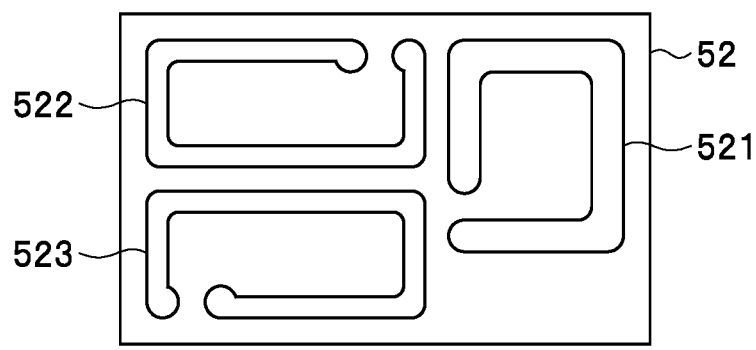
Figure 3C:
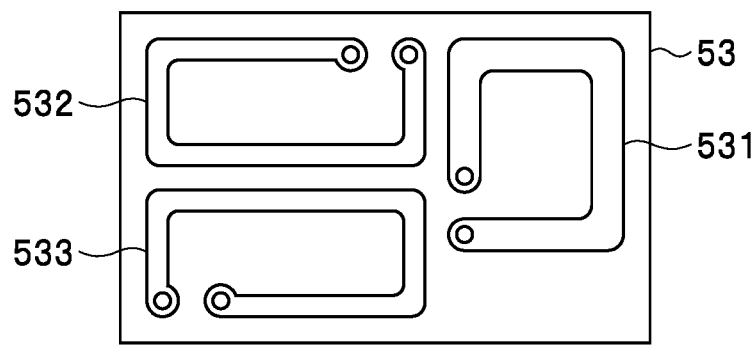

FIG. 3B shows the patterned surface of the second dielectric layer 52. FIG. 3C shows the patterned surface of the third dielectric layer 53. Conductor layers 521, 522, and 523 are formed on the patterned surface of the dielectric layer 52. Conductor layers 531, 532, and 533 are formed on the patterned surface of the dielectric layer 53.

Figure 4A:
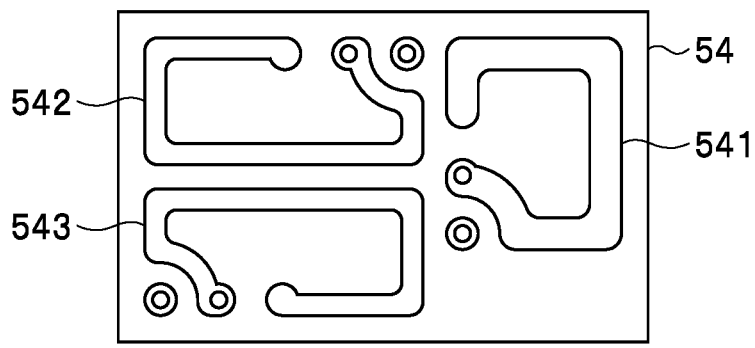
FIG. 4A to FIG. 4C are explanatory diagrams showing respective patterned surfaces of fourth to sixth dielectric layers of the stack of the branching filter of the first embodiment of the invention.
Figure 4B:
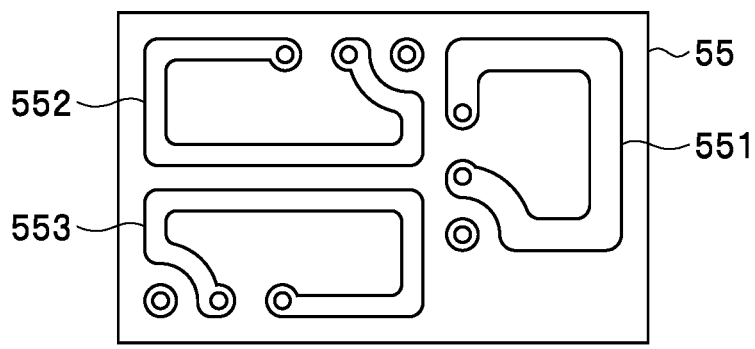
Figure 4C:
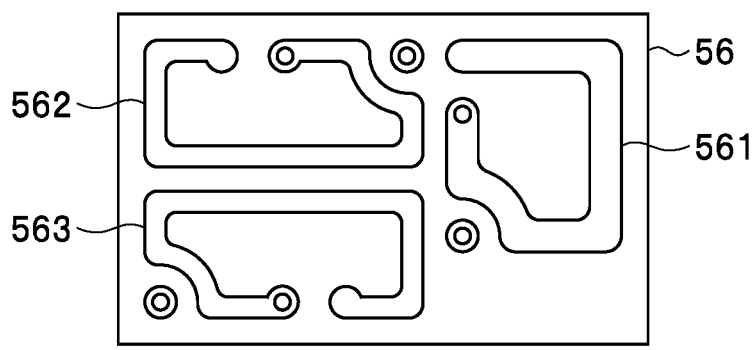

FIG. 4A shows the patterned surface of the fourth dielectric layer 54. FIG. 4B shows the patterned surface of the fifth dielectric layer 55. FIG. 4C shows the patterned surface of the sixth dielectric layer 56. Conductor layers 541, 542, and 543 are formed on the patterned surface of the dielectric layer 54. Conductor layers 551, 552, and 553 are formed on the patterned surface of the dielectric layer 55. Conductor layers 561, 562, and 563 are formed on the patterned surface of the dielectric layer 56.

Figure 5A:
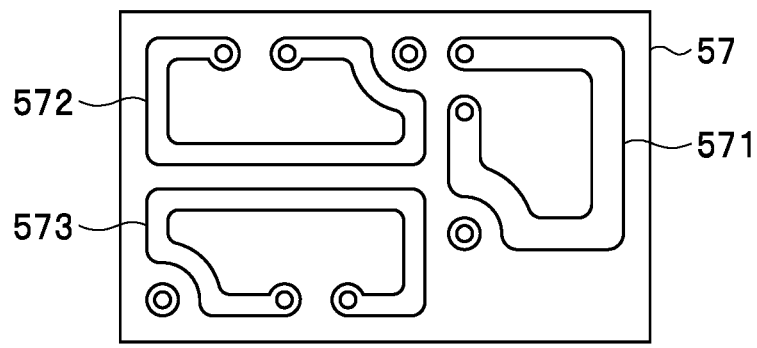
FIG. 5A to FIG. 5C are explanatory diagrams showing respective patterned surfaces of seventh to ninth dielectric layers of the stack of the branching filter of the first embodiment of the invention.
Figure 5B:
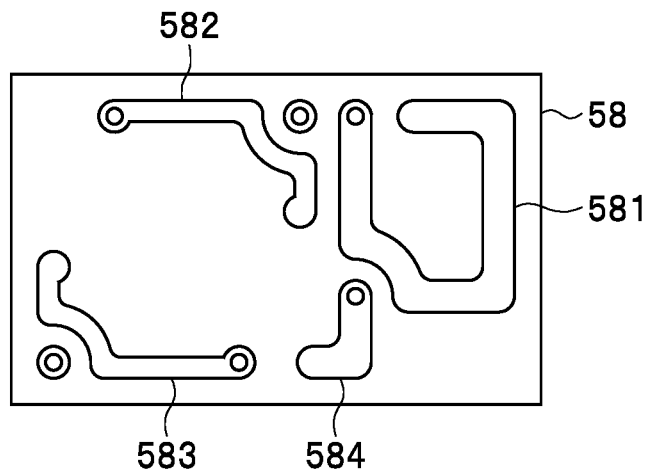
Figure 5C:
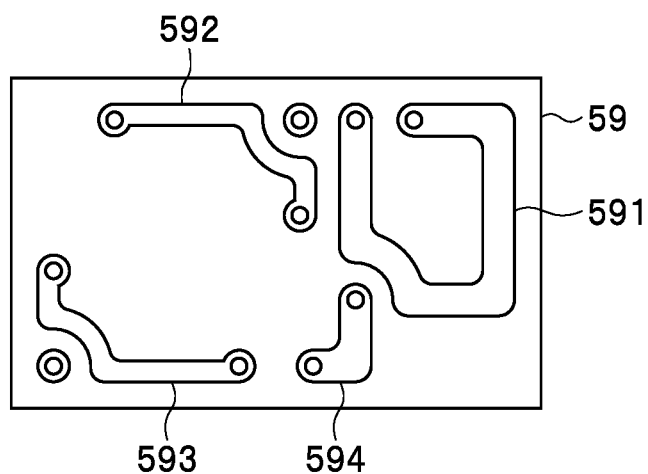

FIG. 5A shows the patterned surface of the seventh dielectric layer 57. FIG. 5B shows the patterned surface of the eighth dielectric layer 58. FIG. 5C shows the patterned surface of the ninth dielectric layer 59. Conductor layers 571, 572, and 573 are formed on the patterned surface of the dielectric layer 57. Conductor layers 581, 582, 583, and 584 are formed on the patterned surface of the dielectric layer 58. Conductor layers 591, 592, 593, and 594 are formed on the patterned surface of the dielectric layer 59.

Figure 6A:
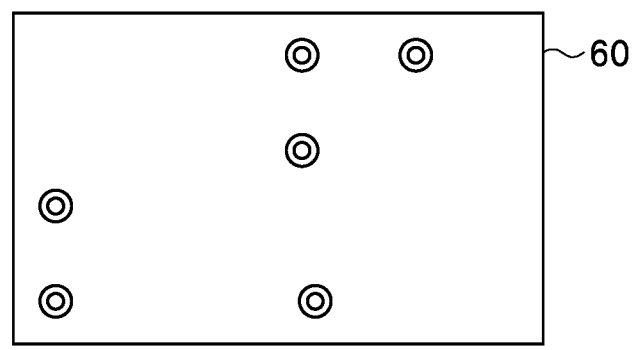
FIG. 6A to FIG. 6C are explanatory diagrams showing respective patterned surfaces of tenth to twelfth dielectric layers of the stack of the branching filter of the first embodiment of the invention.

FIG. 6A shows the patterned surface of the tenth dielectric layer 60. No conductor layer constituting an inductor or capacitor is formed on the patterned surface of the dielectric layer 60.

Figure 6B:
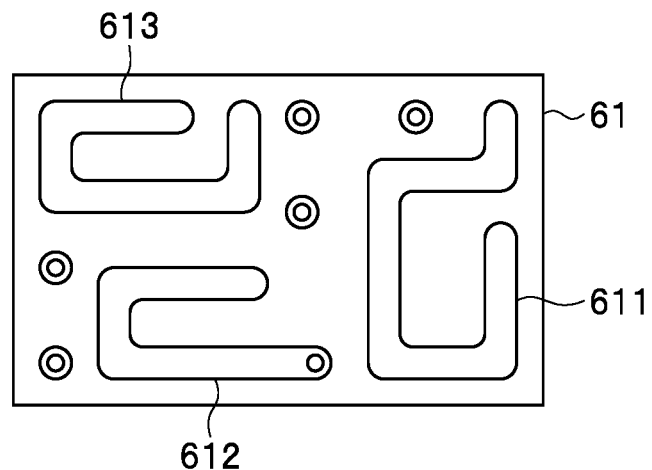
Figure 6C:
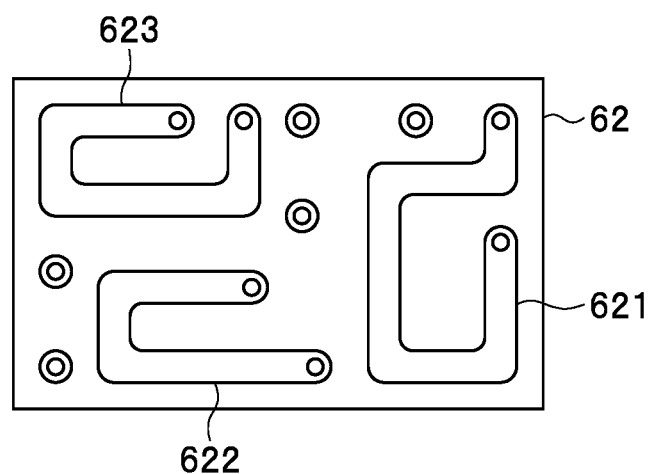

FIG. 6B shows the patterned surface of the eleventh dielectric layer 61. FIG. 6C shows the patterned surface of the twelfth dielectric layer 62. Conductor layers 611, 612, and 613 are formed on the patterned surface of the dielectric layer 61. Conductor layers 621, 622, and 623 are formed on the patterned surface of the dielectric layer 62.

Figure 7A:
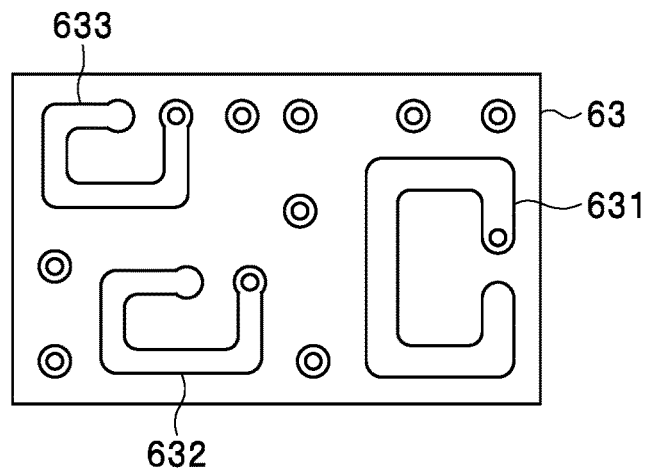
FIG. 7A to FIG. 7C are explanatory diagrams showing respective patterned surfaces of thirteenth to fifteenth dielectric layers of the stack of the branching filter of the first embodiment of the invention.
Figure 7B:
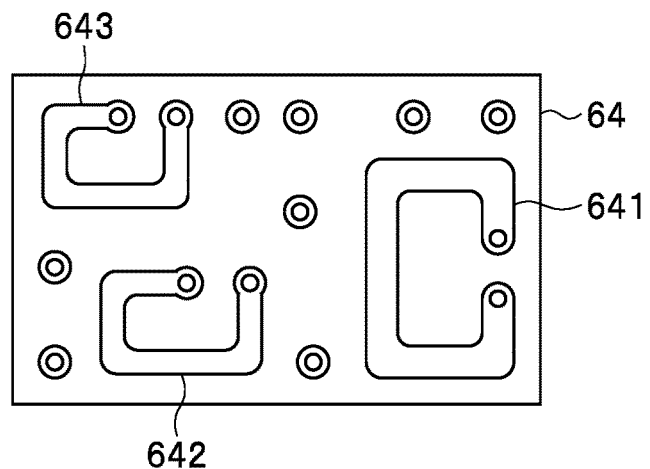
Figure 7C:
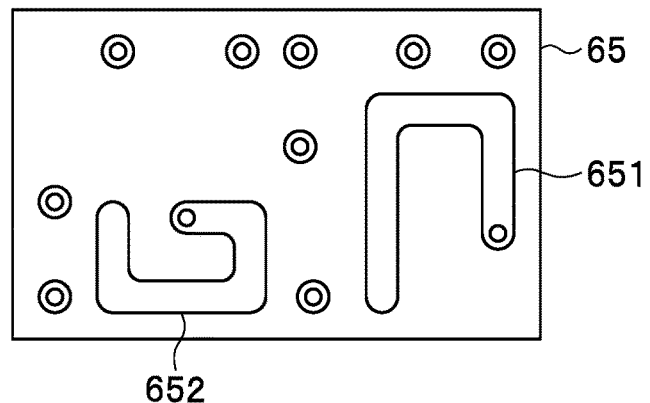

FIG. 7A shows the patterned surface of the thirteenth dielectric layer 63. FIG. 7B shows the patterned surface of the fourteenth dielectric layer 64. FIG. 7C shows the patterned surface of the fifteenth dielectric layer 65. Conductor layers 631, 632, and 633 are formed on the patterned surface of the dielectric layer 63. Conductor layers 641, 642, and 643 are formed on the patterned surface of the dielectric layer 64. Conductor layers 651 and 652 are formed on the patterned surface of the dielectric layer 65.

Figure 8A:
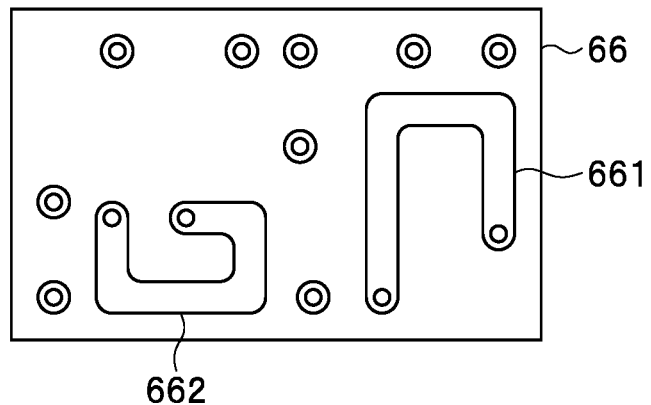
FIG. 8A to FIG. 8C are explanatory diagrams showing respective patterned surfaces of sixteenth to eighteenth dielectric layers of the stack of the branching filter of the first embodiment of the invention.
Figure 8B:
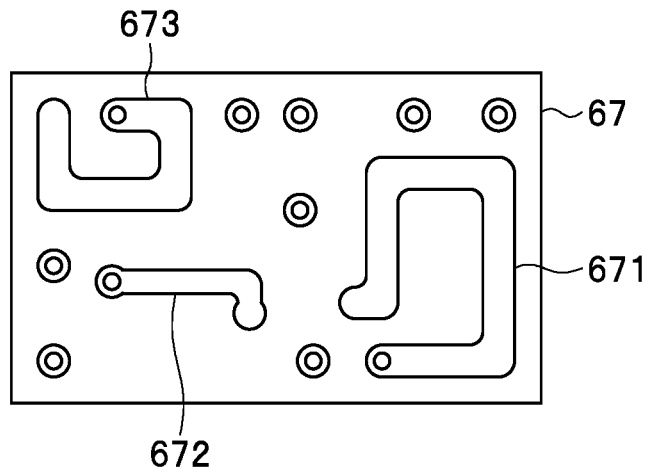
Figure 8C:
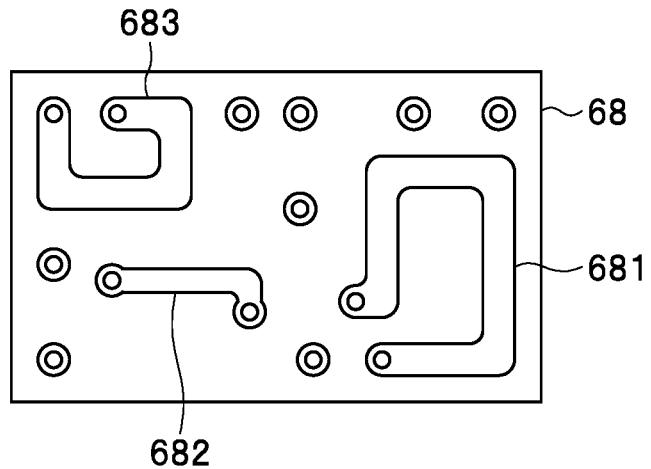

FIG. 8A shows the patterned surface of the sixteenth dielectric layer 66. FIG. 8B shows the patterned surface of the seventeenth dielectric layer 67. FIG. 8C shows the patterned surface of the eighteenth dielectric layer 68. Conductor layers 661 and 662 are formed on the patterned surface of the dielectric layer 66. Conductor layers 671, 672, and 673 are formed on the patterned surface of the dielectric layer 67. Conductor layers 681, 682, and 683 are formed on the patterned surface of the dielectric layer 68.

Figure 9A:
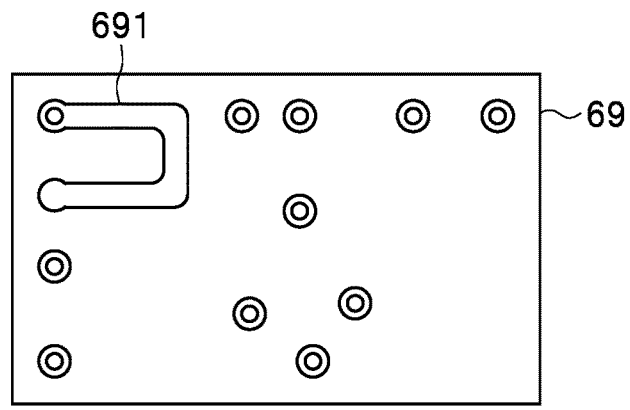
FIG. 9A to FIG. 9C are explanatory diagrams showing respective patterned surfaces of nineteenth to twenty-first dielectric layers of the stack of the branching filter of the first embodiment of the invention.
Figure 9B:
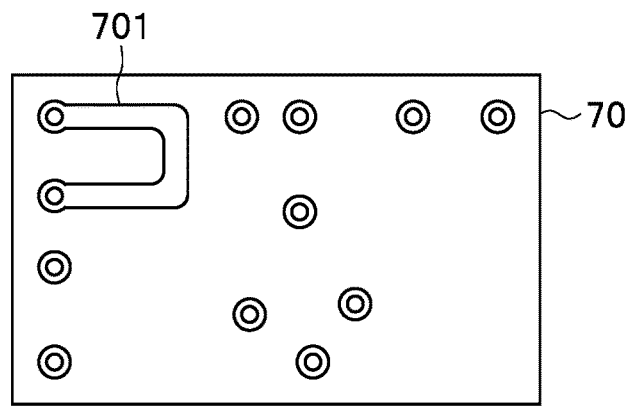

FIG. 9A shows the patterned surface of the nineteenth dielectric layer 69. FIG. 9B shows the patterned surface of the twentieth dielectric layer 70. Conductor layer 691 is formed on the patterned surface of the dielectric layer 69. Conductor layer 701 is formed on the patterned surface of the dielectric layer 70.

Figure 9C:
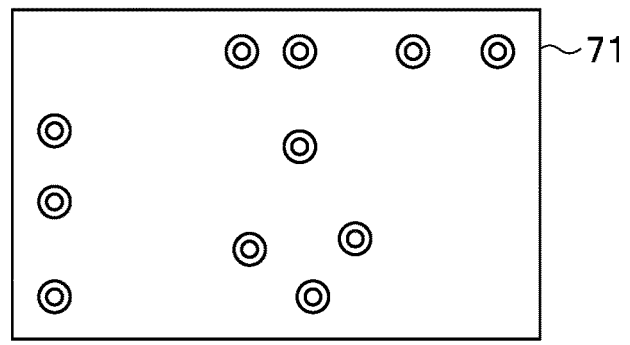

FIG. 9C shows the patterned surface of the twenty-first dielectric layer 71. No conductor layer constituting an inductor or capacitor is formed on the patterned surface of the dielectric layer 71.

Figure 10A:
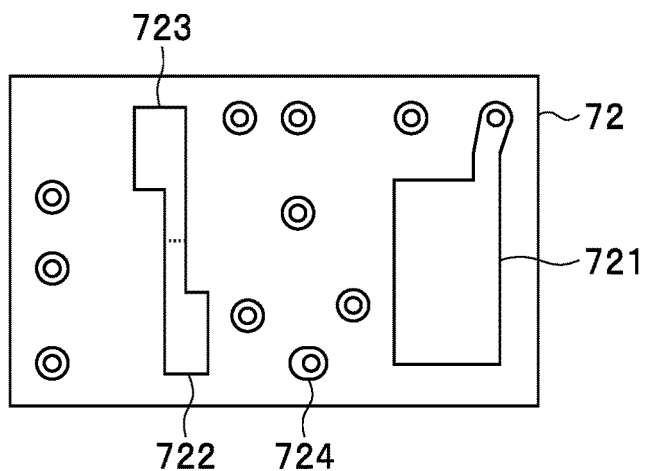
FIG. 10A to FIG. 10C are explanatory diagrams showing respective patterned surfaces of twenty-second to twenty-fourth dielectric layers of the stack of the branching filter of the first embodiment of the invention.

FIG. 10A shows the patterned surface of the twenty-second dielectric layer 72. Conductor layers 721, 722, 723, and 724 are formed on the patterned surface of the dielectric layer 72. The conductor layer 722 is connected to the conductor layer 723. In FIG. 10A, the border between the conductor layer 722 and the conductor layer 723 is indicated by a dotted line.

Figure 10B:
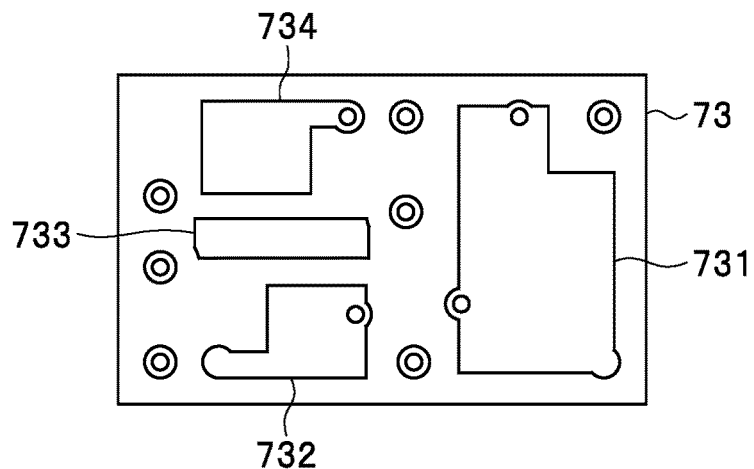

FIG. 10B shows the patterned surface of the twenty-third dielectric layer 73. Conductor layers 731, 732, 733, and 734 are formed on the patterned surface of the dielectric layer 73.

Figure 10C:
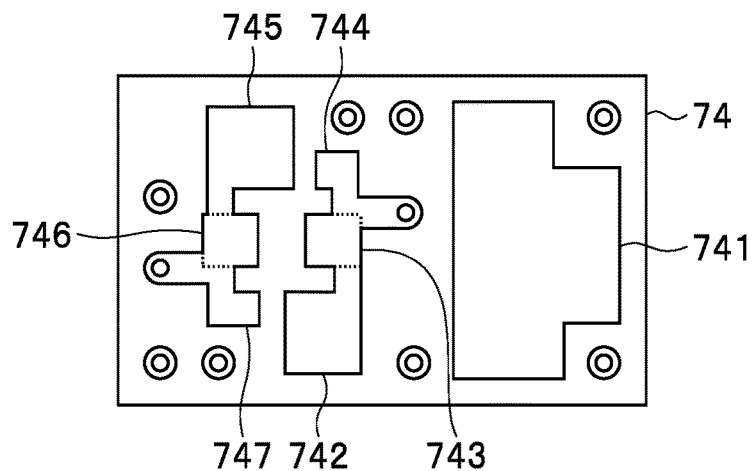

FIG. 10C shows the patterned surface of the twenty-fourth dielectric layer 74. Conductor layers 741, 742, 743, 744, 745, 746, and 747 are formed on the patterned surface of the dielectric layer 74. The conductor layer 742 is connected to the conductor layer 743. The conductor layer 743 is connected to the conductor layer 744. The conductor layer 745 is connected to the conductor layer 746. The conductor layer 746 is connected to the conductor layer 747. In FIG. 10C, the border between the two conductor layers is shown with dotted lines.

Figure 11A:
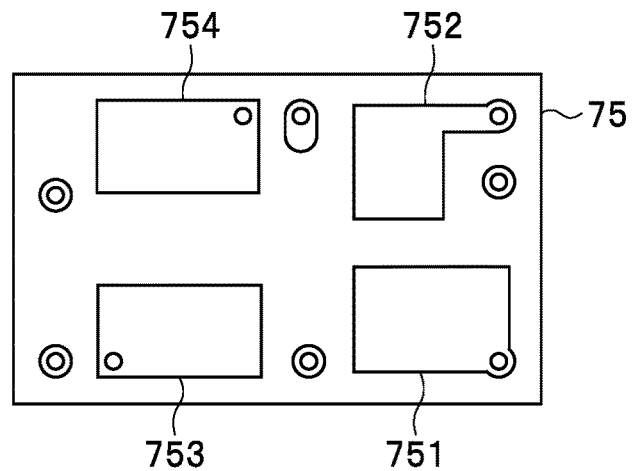
FIG. 11A to FIG. 11C are explanatory diagrams showing respective patterned surfaces of twenty-fifth to twenty-seventh dielectric layers of the stack of the branching filter of the first embodiment of the invention.

FIG. 11A shows the patterned surface of the twenty-fifth dielectric layer 75. Conductor layers 751, 752, 753, and 754 are formed on the patterned surface of the dielectric layer 75.

Figure 11B:
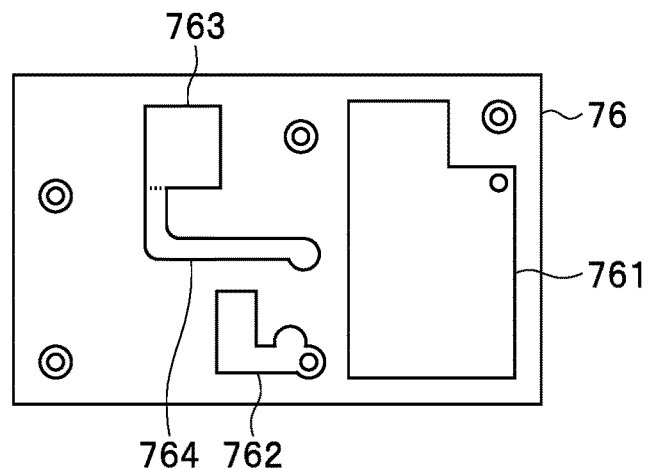

FIG. 11B shows the patterned surface of the twenty-sixth dielectric layer 76. Conductor layers 761, 762, 763, and 764 are formed on the patterned surface of the dielectric layer 76. The conductor layer 763 is connected to the conductor layer 764. In FIG. 11B, the border between the conductor layer 763 and the conductor layer 764 is indicated by a dotted line.

Figure 11C:
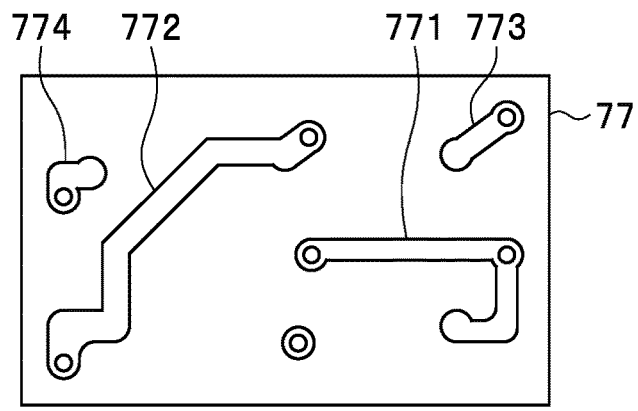

FIG. 11C shows the patterned surface of the twenty-seventh dielectric layer 77. Conductor layers 771, 772, 773, and 774 are formed on the patterned surface of the dielectric layer 77.

Figure 12:
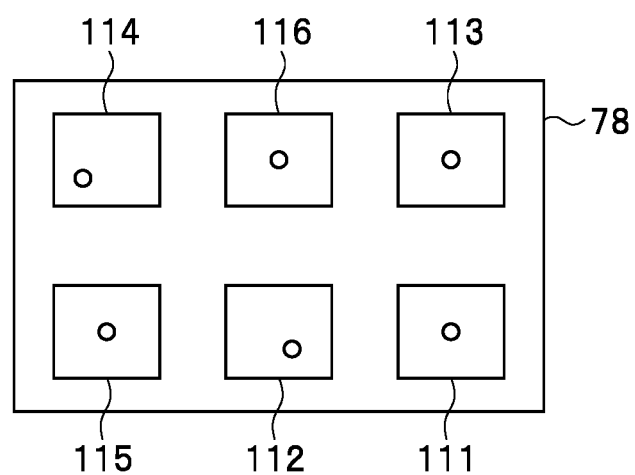
FIG. 12 is an explanatory diagram showing a patterned surface of twenty-eighth dielectric layer of the stack of the branching filter of the first embodiment of the invention.

FIG. 12 shows the patterned surface of the twenty-eighth dielectric layer 78. The terminals 111 to 116 are formed on the patterned surface of the dielectric layer 78.

The stack 50 shown in FIG. 2 is formed by stacking the first to twenty-eighth dielectric layers 51 to 78 such that the patterned surface of the twenty-eighth dielectric layer 78 serves as the bottom surface 50A of the stack 50 and the surface of the first dielectric layer 51 opposite to the patterned surface thereof serves as the top surface 50B of the stack 50.

Each of the through holes shown in FIG. 3C to FIG. 12 is connected to a conductor layer overlapping in the stacking direction T or another thorough hole overlapping in the stacking direction T when the second to twenty-eighth dielectric layers 52 to 78 are stacked. Among the plurality of through holes shown in FIG. 3C to FIG. 12, ones located within a terminal or a conductor layer are connected to the terminal or the conductor layer.

Figure 13:
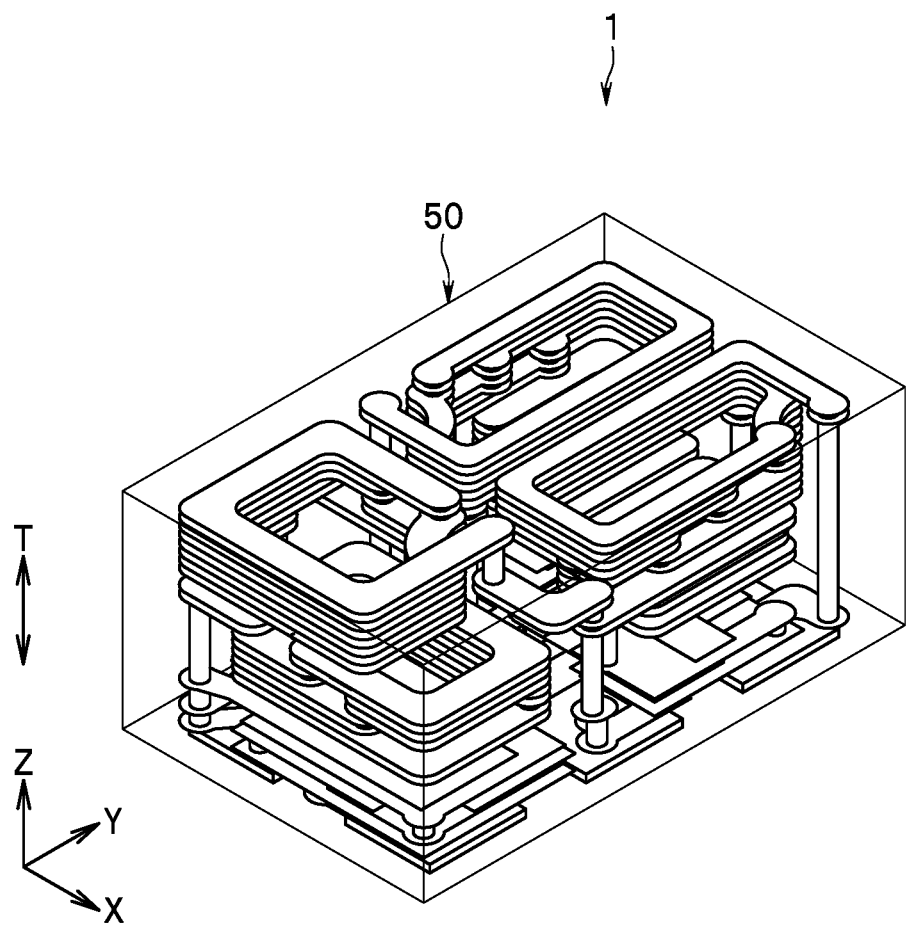
FIG. 13 is an internal perspective view showing the stack of the branching filter of the first embodiment of the invention.

FIG. 13 shows the internal structure of the stack 50 formed by stacking the first to twenty-eighth dielectric layers 51 to 78. As shown in FIG. 13, the plurality of conductor layers and the plurality of through holes shown in FIG. 3A to 12 are stacked inside the stack 50. In FIG. 13, the mark 511 is omitted.

Correspondences between the circuit components of the branching filter 1 shown in FIG. 1 and the internal components of the stack 50 shown in FIG. 3B to FIG. 11C will now be described. Initially, the components of the first filter 10 will be described. The inductor L11 is composed of the conductor layers 521, 531, 541, 551, 561, 571, 581, and 591 shown in FIG. 3B to FIG. 5C, and the through holes connected to those conductor layers.

The inductor L12 is composed of the conductor layers 611, 621, 631, 641, 651, 661, 671, and 681 shown in FIG. 6B to FIG. 8C, and the through holes connected to those conductor layers.

The capacitor C11 is composed of the conductor layers 731, 741, 751, and 761 shown in FIG. 10B to FIG. 11B, and the dielectric layers 54 to 76 interposed between those conductor layers.

The capacitor C12 is composed of the conductor layers 741, 752, and 761 shown in FIG. 10C to FIG. 11B, and the dielectric layers 75 and 76 interposed between those conductor layers.

The capacitor C13 is composed of the conductor layers 721 and 731 shown in FIG. 10A and FIG. 10B, and the dielectric layer 73 interposed between those conductor layers.

Next, the components of the LC circuit 24 of the second filter 20 will be described. The inductor L21 is composed of the conductor layers 612, 622, 632, 642, 652, 662, 672, and 682 shown in FIG. 6B to FIG. 8C, and the through holes connected to those conductor layers.

The capacitor C21 is composed of the conductor layers 753 and 762 shown in FIG. 11A and FIG. 11B, and the dielectric layer 76 interposed between those conductor layers.

Next, the components of the LC circuit 25 of the second filter 20 will be described. The inductor L31 is composed of the conductor layers 522, 532, 542, 552, 562, 572, 582, and 592 shown in FIG. 3B to FIG. 5C and the through holes connected to those conductor layers.

The inductor L32 is composed of the conductor layers 523, 533, 543, 553, 563, 573, 583, and 593 shown in FIG. 3B to FIG. 5C, and the through holes connected to those conductor layers.

The capacitor C31 is composed of the conductor layers 732, 742, and 753 shown in FIG. 10B to FIG. 11A, and the dielectric layer 74 and 75 interposed between those conductor layers.

The capacitor C32 is composed of the conductor layers 733 and 743 shown in FIG. 10B and FIG. 10C, and the dielectric layer 74 interposed between those conductor layers.

The capacitor C33 is composed of the conductor layers 733 and 746 shown in FIG. 10B and FIG. 10C, and the dielectric layer 74 interposed between those conductor layers.

The capacitor C34 is composed of the conductor layers 734, 745, and 754 shown in FIG. 10B to FIG. 11A, and the dielectric layers 74 and 75 interposed between those conductor layers.

The capacitor C35 is composed of the conductor layers 747 and 753 shown in FIG. 10C and FIG. 11A, and the dielectric layer 75 interposed between those conductor layers.

The capacitor C36 is composed of the conductor layers 744 and 754 shown in FIG. 10C and FIG. 11A, and the dielectric layer 75 interposed between those conductor layers.

The capacitor C37 is composed of the conductor layers 722 and 732 shown in FIG. 10A and FIG. 10B, and the dielectric layer 73 interposed between those conductor layers.

The capacitor C38 is composed of the conductor layers 723 and 734 shown in FIG. 10A and FIG. 10B, and the dielectric layer 73 interposed between those conductor layers.

Next, the components of the LC circuit 26 of the second filter 20 will be described. The inductor L22 is composed of the conductor layers 613, 623, 633, 643, 673, 683, 691, and 701 shown in FIG. 6B to FIG. 7B and FIG. 8B to FIG. 9B, and the through holes connected to those conductor layers.

The inductor L23 is composed of the conductor layers 764 shown in FIG. 11B.

The capacitor C22 is composed of the conductor layers 754 and 763 shown in FIG. 11A and FIG. 11B, and the dielectric layer 76 interposed between those conductor layers.

Next, structural features of the branching filter 1 of the present embodiment will be described. As described above, the circuit configuration of the LC circuit 25 is symmetric with respect to the connection point of the capacitors C32 and C33. In the present embodiment, the plurality of conductor layers constituting the LC circuit 25 are symmetric when viewed in one direction (Z direction) parallel to the stacking direction T.

For example, the inductors L31 and L32 are symmetrically disposed with respect to the connection point of the capacitors C32 and C33 in the circuit configuration. The conductor layer 522 shown in FIG. 3B is an inductor conductor layer for constituting the inductor L31, and the conductor layer 523 shown in FIG. 3B is an inductor conductor layer for constituting the inductor L32. The conductor layers 522 and 523 are disposed at the same position in the stacking direction T. The conductor layers 522 and 523 are point symmetric or substantially point symmetric to each other when viewed in one direction (Z direction) parallel to the stacking direction T.

The above description for the pair of the conductor layers 522 and 523 also applies to the pair of the conductor layers 532 and 533, the pair of the conductor layers 542 and 543, the pair of the conductor layers 552 and 553, the pair of the conductor layers 562 and 563, the pair of the conductor layers 572 and 573, the pair of the conductor layers 582 and 583, and the pair of the conductor layers 592 and 593.

Similarly, the capacitors C31 and C34 are symmetrically disposed with respect to the connection point of the capacitors C32 and C33 in the circuit configuration. The conductor layer 732 shown in FIG. 10B is a capacitor conductor layer for constituting the capacitor C31, and the conductor layer 734 shown in FIG. 10B is a capacitor conductor layer for constituting the capacitor C34. The conductor layers 732 and 734 are disposed at the same position in the stacking direction T. The conductor layers 732 and 734 are point symmetric or substantially point symmetric to each other when viewed in one direction (Z direction) parallel to the stacking direction T.

The above description for the pair of the conductor layers 732 and 734 also applies to the pair of the conductor layers 722 and 723, the pair of the conductor layers 742 and 745, the pair of the conductor layers 743 and 746, the pair of the conductor layers 744 and 747, and the pair of the conductor layers 753 and 754. Each pair of conductor layers constitutes two capacitors symmetrically disposed with respect to the connection point of the capacitors C32 and C33 in the circuit configuration.

As described above, the LC circuit of the present embodiment, in other words, the LC circuit 25 includes at least the capacitor C31 provided between the first connection point P1 and the second connection point P2, the capacitors C32 and C33 provided between the second connection point P2 and the third connection point P3, the capacitor C34 provided between the third connection point P3 and the fourth connection point P4, the capacitor C35 provided between the first connection point P1 and the third connection point P3, the capacitor C36 provided between the second connection point P2 and the fourth connection point P4, the inductor L31 connected to the second connection point P2, and the inductor L32 connected to the third connection point P3.

The filter of the present embodiment, in other words, the second filter 20 includes at least the first signal port 21 and the second signal port 22 each used for signal inputting or outputting, the signal path 23 that connects the first signal port 21 and the second signal port 22 and along which the first connection point P1, the second connection point P2, the third connection point P3, and the fourth connection point P4 are sequentially provided, the capacitors C32 and C33 provided between the second connection point P2 and the third connection point P3, the capacitor C35 provided between the first connection point P1 and the third connection point P3, the capacitor C36 provided between the second connection point P2 and the fourth connection point P4, the inductor L31 connected to the second connection point P2, and the inductor L32 connected to the third connection point P3.

According to the present embodiment, the LC circuit 25 and the second filter 20 can be miniaturized with a desired characteristic satisfied. This effect will be described below with reference to results of first and second simulations.

First, the first simulation will be described. In the first simulation, a model of a first practical example and models of first and second comparative examples were used. The model of the first practical example is a model of the LC circuit according to the present embodiment, in other words, the LC circuit 25. The model of the first comparative example is a model of an LC circuit 101 of the first comparative example. The model of the second comparative example is a model of an LC circuit 201 of the second comparative example.

Figure 14:
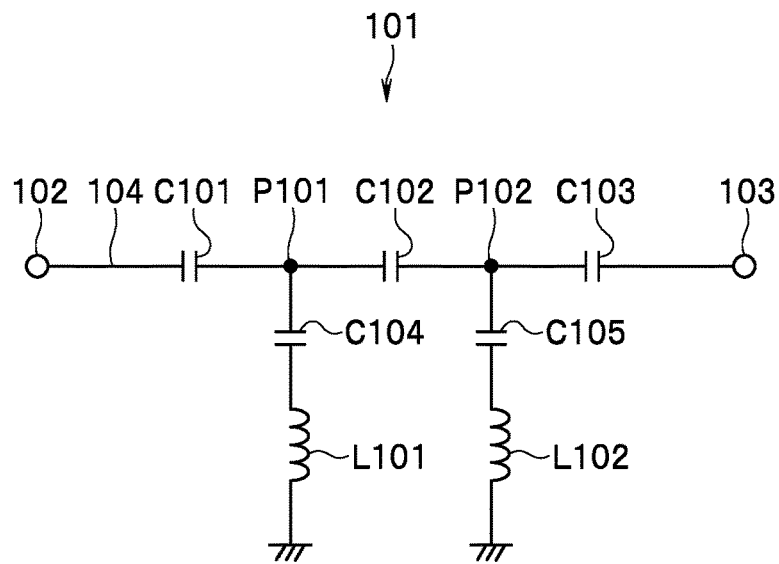
FIG. 14 is a circuit diagram showing a circuit configuration of an LC circuit of a first comparative example.

Circuit configurations of the LC circuit 101 of the first comparative example and the LC circuit 201 of the second comparative example will be described below. FIG. 14 is a circuit diagram showing a circuit configuration of the LC circuit 101 of the first comparative example. The LC circuit 101 includes a first signal port 102, a second signal port 103, and a signal path 104. The signal path 104 connects the first signal port 102 and the second signal port 103. A first connection point P101 and a second connection point P102 are provided on the signal path 104.

The LC circuit 101 further includes inductors L101 and L102 and capacitors C101, C102, C103, C104, and C105. The capacitor C101 is provided between the first signal port 102 and the first connection point P101. The capacitor C102 is provided between the first connection point P101 and the second connection point P102. The capacitor C103 is provided between the second connection point P102 and the second signal port 103.

One end of the capacitor C104 is connected to the first connection point P101. The other end of the capacitor C104 is connected to one end of the inductor L101. The other end of the inductor L101 is connected to the ground.

One end of the capacitor C105 is connected to the second connection point P102. The other end of the capacitor C105 is connected to one end of the inductor L102. The other end of the inductor L102 is connected to the ground.

The inductors L101 and L102 and the capacitors C101 to C105 of the LC circuit 101 constitute a high-pass filter.

Figure 15:
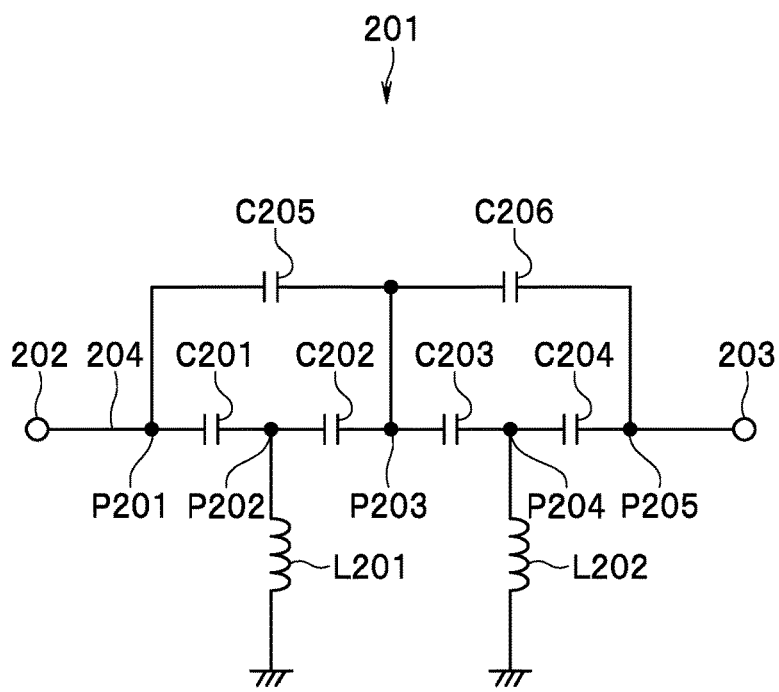
FIG. 15 is a circuit diagram showing a circuit configuration of an LC circuit of a second comparative example.

FIG. 15 is a circuit diagram showing a circuit configuration of the LC circuit 201 of the second comparative example. The LC circuit 201 of the second comparative example corresponds to a circuit in which connection of three capacitors in the LC circuit 101 of the first comparative example is converted from Y-type connection to Δ-type connection. After the capacitor C102 in the LC circuit 101 of the first comparative example is divided into two capacitors, the LC circuit 101 of the first comparative example is converted as described above such that two Δ-type connections are provided in the LC circuit 201 of the second comparative example.

The LC circuit 201 includes a first signal port 202, a second signal port 203, and a signal path 204. The signal path 204 connects the first signal port 202 and the second signal port 203. In addition, a first connection point P201, a second connection point P202, a third connection point P203, a fourth connection point P204, and a fifth connection point P205 are sequentially provided on the signal path 204. The first connection point P201 is connected to the first signal port 202. The fifth connection point P205 is connected to the second signal port 203.

The LC circuit 201 further includes inductors L201 and L202 and capacitors C201, C202, C203, C204, C205, and C206. The capacitor C201 is provided between the first connection point P201 and the second connection point P202. The capacitor C202 is provided between the second connection point P202 and the third connection point P203. The capacitor C203 is provided between the third connection point P203 and the fourth connection point P204. The capacitor C204 is provided between the fourth connection point P204 and the fifth connection point P205.

The capacitor C205 is provided between the first connection point P201 and the third connection point P203. The capacitor C206 is provided between the third connection point P203 and the fifth connection point P205.

One end of the inductor L201 is connected to the second connection point P202. One end of the inductor L202 is connected to the fourth connection point P204. The other ends of the inductors L201 and L202 are connected to the ground.

The inductors L201 and L202 and the capacitors C201 to C206 of the LC circuit 201 constitute a high-pass filter.

The LC circuit 25 of the present embodiment corresponds to a circuit in which the capacitor C205 in the LC circuit 201 of the second comparative example is provided between the first connection point P201 and the fourth connection point P204 and the capacitor C206 in the LC circuit 201 of the second comparative example is provided between the second connection point P202 and the fifth connection point P205.

In the first simulation, the LC circuits 25, 101, and 201 were designed such that high-pass filters of the same characteristic are achieved. The low-range cutoff frequency of the high-pass filters was 1.28 GH.

Next, a result of the first simulation will be described. In the first simulation, the total capacitance of the capacitors C31 to C38 included in the LC circuit 25 in the model of the first practical example was 2.6 pF. The total capacitance of the capacitors C101 to C105 included in the LC circuit 101 of the first comparative example was 12 pF. The total capacitance of the capacitors C201 to C206 included in the LC circuit 201 of the second comparative example was 5.5 pF.

As understood from the result of the first simulation, the total capacitance of the LC circuit 25 of the present embodiment is smaller than those of the LC circuit 101 of the first comparative example and the LC circuit 201 of the second comparative example. When capacitors are constituted by using conductor layers included in the stack 50 as in the branching filter 1 in the present embodiment, the area of the conductor layers decreases as the capacitance decreases. Thus, the LC circuit 25 is physically smaller than the LC circuits 101 and 201. In this manner, according to the present embodiment, the LC circuit 25 can be miniaturized with a high-pass filter characteristic maintained.

Moreover, according to the present embodiment, the second filter 20 including the LC circuit 25 can be miniaturized, and the branching filter 1 including the second filter 20 can be miniaturized as well.

Next, the second simulation will be described. In the second simulation, a model of a second practical example and a model of a third comparative example were used. The model of the second practical example is a model of the branching filter 1 in the present embodiment and is a model in which constituent components of the branching filter 1 are integrated by using the stack 50.

Figure 16:
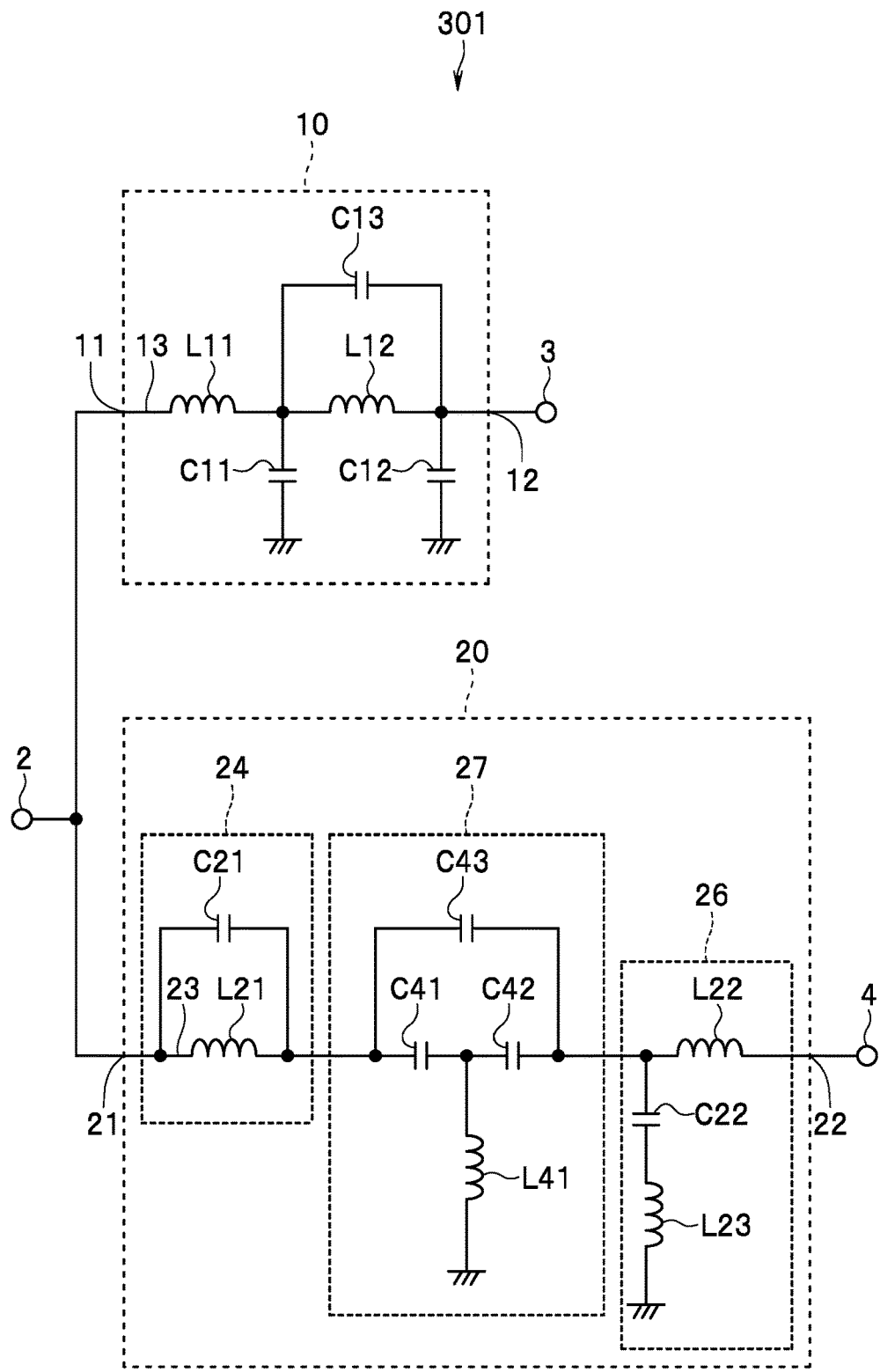
FIG. 16 is a circuit diagram showing a circuit configuration of an LC circuit of a third comparative example.

The model of the third comparative example is a model of a branching filter 301 of a comparative example and is a model in which constituent components of the branching filter 301 are integrated by using the stack 50. FIG. 16 is a circuit diagram showing a circuit configuration of the branching filter 301 of the comparative example. Configuration of the branching filter 301 of the comparative example is the same as the configuration of the branching filter 1 in the present embodiment except for the LC circuit 25 of the second filter 20. The branching filter 301 of the comparative example includes an LC circuit 27 in place of the LC circuit 25.

The LC circuit 27 includes an inductor L41, and capacitors C41, C42, and C43. One end of the capacitor C41 is connected to the inductor L21 of the LC circuit 24. The other end of the capacitor C41 is connected to one end of the capacitor C42. The other end of the capacitor C42 is connected to the inductor L22 of the LC circuit 26.

One end of the capacitor C43 is connected to the one end of the capacitor C41. The other end of the capacitor C43 is connected to the other end of the capacitor C42. One end of the inductor L41 is connected to a connection point between the capacitor C41 and the capacitor C42. The other end of the inductor L41 is connected to the ground.

The stack 50 in the model of the second practical example and the stack 50 in the model of the third comparative example have the same dimension. In the second simulation, the dimension of the stack 50 in the X direction was 1.25 mm, the dimension of the stack 50 in the Y direction was 2.00 mm, and the dimension of the stack 50 in the Z direction was 0.80 mm.

In the second simulation, the branching filters 1 and 301 are designed such that a diplexer is achieved with the restricted dimensions of the stack 50 as described above.

Next, a result of the second simulation will be described. In the second simulation, the total capacitance of the capacitors C31 to C38 included in the LC circuit 25 in the model of the second practical example was 2.68 pF. The capacitance of the capacitor C31 was 0.83 pF, the total capacitance of the capacitors C32 and C33 was 0.20 pF, the capacitance of the capacitor C34 was 0.78 pF, the capacitance of the capacitor C35 was 0.05 pF, the capacitance of the capacitor C36 was 0.62 pF, and the total capacitance of the capacitors C37 and C38 was 0.17 pF.

In addition, in the second simulation, the total capacitance of the capacitors C41 to C43 included in the LC circuit 27 in the model of the third comparative example was 2.2 pF. The capacitance of the capacitor C41 was 0.75 pF, the capacitance of the capacitor C42 was 1.10 pF, and the capacitance of the capacitor C43 was 0.35 pF.

Figure 17:
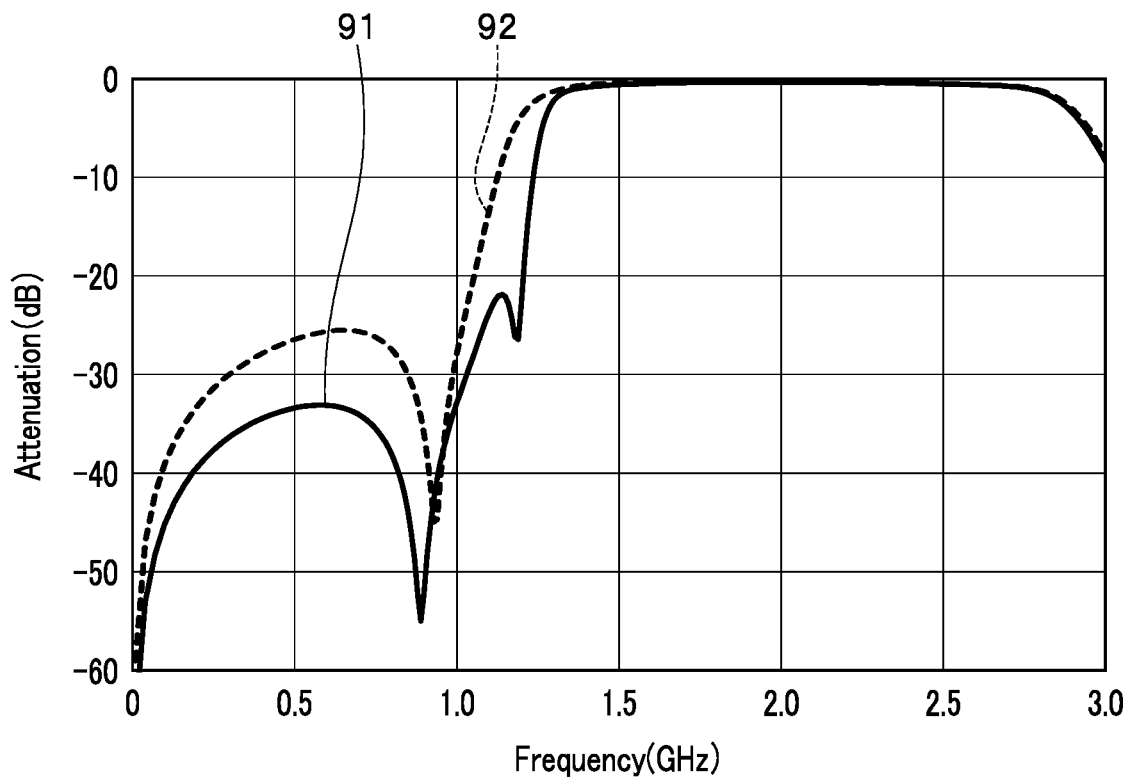
FIG. 17 is a characteristic diagram showing a pass characteristic of a second filter in each of a model of a second practical example and a model of a third comparative example.

FIG. 17 is a characteristic diagram showing pass characteristics of the second filter 20 (hereinafter referred to as the filter of a practical example) in the model of the second practical example and the second filter 20 (hereinafter referred to as a filter of the comparative example) in the model of the third comparative example. In FIG. 17, the horizontal axis represents frequency, and the vertical axis represents attenuation. In FIG. 17, a curve denoted by a reference numeral 91 represents the pass characteristic of the filter of the practical example, and a curve denoted by a reference numeral 92 represents the pass characteristic of the filter of the comparative example.

As shown in FIG. 17, the gradient of attenuation change in accordance with frequency change is larger for the filter of the practical example than for the filter of the comparative example in a frequency band in the vicinity of a passband on the lower side of the passband. In addition, the absolute value of attenuation is larger for the filter of the practical example than for the filter of the comparative example in a frequency band on the lower side of the passband, the frequency band including the passband of the first filter 10 (low-pass filter). Thus, the filter of the practical example has a more favorable characteristic than that of the filter of the comparative example.

As understood from the result of the second simulation, according to the present embodiment, a favorable characteristic can be achieved even when the dimensions of the stack 50 is restricted.

The results of the first and second simulations indicate that, according to the present embodiment, it is possible to achieve the LC circuit 25 that can be miniaturized with a desired characteristic satisfied. Moreover, according to the present embodiment, it is possible to achieve the second filter 20 that can be miniaturized with a desired characteristic satisfied.

Other effects of the present embodiment will be described below. According to the present embodiment, since the LC circuit 25 can be miniaturized, it is possible to provide, without increasing the dimensions of the stack 50, another circuit at least one of between the LC circuit 25 and the first signal port 21 (between the first connection point P1 and the first signal port 21) or between the LC circuit 25 and the second signal port 22 (between the fourth connection point P4 and the second signal port 22). Thus, according to the present embodiment, it is possible to achieve the second filter 20 that satisfies a desired characteristic.

Specifically, in the present embodiment, the LC circuit 24 is provided between the LC circuit 25 and the first signal port 21, and the LC circuit 26 is provided between the LC circuit 25 and the second signal port 22. The LC circuits 24 and 26 each function as a low-pass filter. Thus, according to the present embodiment, it is possible to achieve the second filter 20 that functions as a band-pass filter.

Moreover, in the present embodiment, the plurality of conductor layers constituting the LC circuit 25 are symmetric when viewed in one direction (Z direction) parallel to the stacking direction T as described above. Thus, according to the present embodiment, the plurality of conductor layers constituting the LC circuit 25 can be disposed with balance.

Second Embodiment

Figure 18:
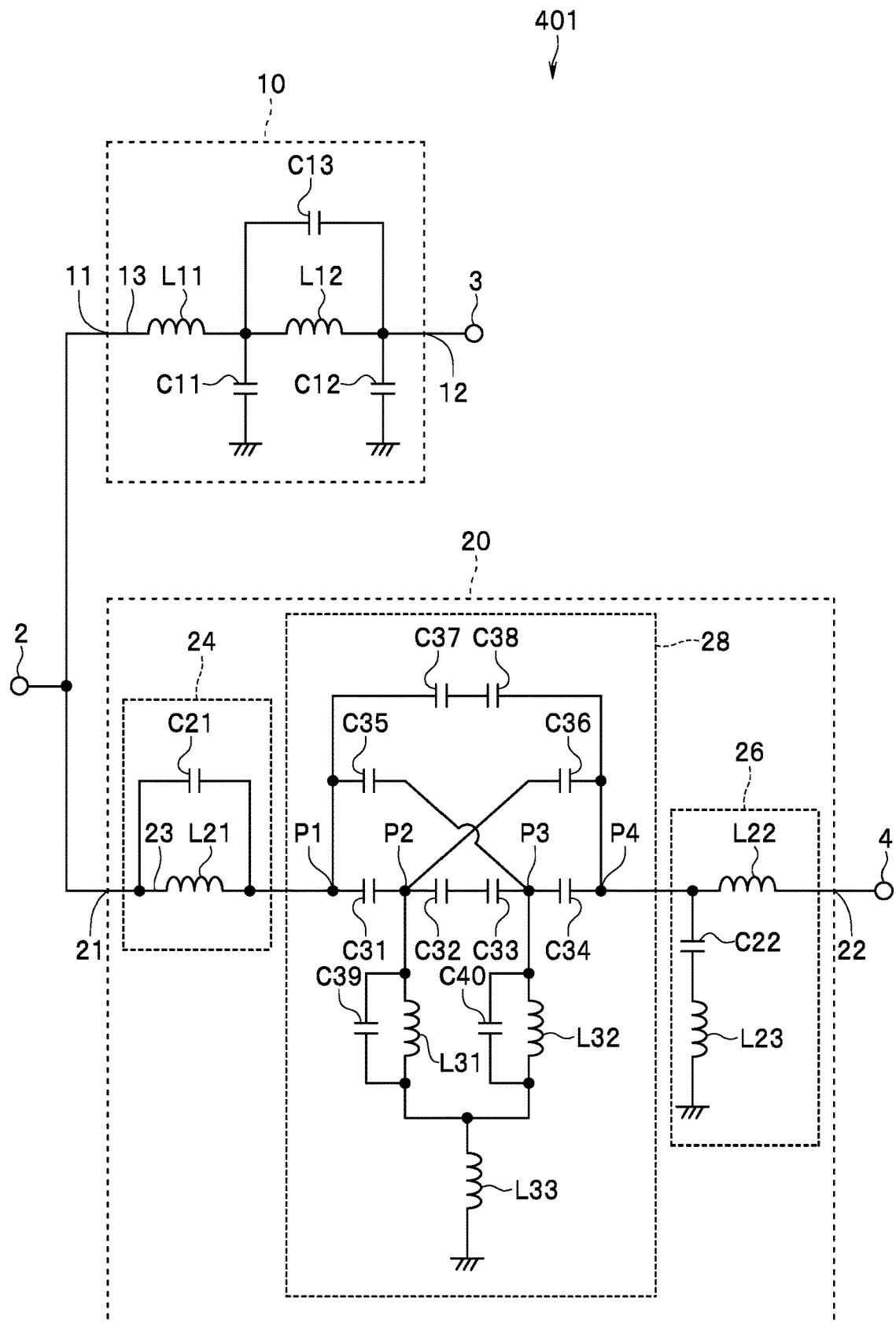
FIG. 18 is a circuit diagram showing a circuit configuration of a branching filter of a second embodiment of the invention.

A description of the configuration of a branching filter of the second embodiment of the invention will be given with reference to FIG. 18. FIG. 18 is a circuit diagram showing circuit configuration of a branching filter of the present embodiment.

Configuration of a branching filter 401 of the present embodiment is basically the same as that of the branching filter 1 in the first embodiment. As in the branching filter 1, the branching filter 401 is a diplexer including the first filter 10 and the second filter 20. However, the branching filter 401 is different from the branching filter 1 in the following points. In the present embodiment, the second filter 20 includes an LC circuit 28 in place of the LC circuit 25 of the first embodiment. The LC circuit 28 includes an inductor L33 and capacitors C39 and C40 in addition to the constituent components (the inductors L31 and L32 and the capacitors C31 to C38) of the LC circuit 25.

The inductor L33 is provided between the inductors L31 and L32 and the ground. In the present embodiment, one end of the inductor L33 is connected to each of the inductors L31 and L32. The other end of the inductor L33 is connected to the ground.

The capacitor C39 is connected to the connection point P2 and connected in parallel to the inductor L31. The capacitor C40 is connected to the connection point P3 and connected in parallel to the inductor L32.

The LC circuit 28 corresponds to the LC circuit according to the present embodiment. In the present embodiment, a resonance circuit constituted by the inductor L31 and the capacitor C39 is connected to the connection point P2, and a resonance circuit constituted by the inductor L32 and the capacitor C40 is connected to the connection point P3.

Other configuration, operation and effects of the present embodiment are the same as those of the first embodiment.

The present invention is not limited to the foregoing embodiments, and various modifications may be made thereto. For example, the number of connection points provided on the signal path 23 in the LC circuit 25 may be equal to or larger than five.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A filter comprising:
   a first signal port and a second signal port each used for signal inputting or outputting;
   a signal path that connects the first signal port and the second signal port and on which a first connection point, a second connection point, a third connection point, and a fourth connection point are sequentially provided;
   a first capacitor provided between the second connection point and the third connection point;
   a second capacitor provided between the first connection point and the third connection point;
   a third capacitor provided between the second connection point and the fourth connection point;
   a first inductor connected to the second connection point;
   a second inductor connected to the third connection point; and
   a stack for integrating the first to third capacitors and the first and second inductors, the stack including a plurality of dielectric layers and conductor layers that are stacked,
   wherein the plurality of conductor layers include a plurality of capacitor conductor layers for constituting the first to third capacitors and a plurality of inductor conductor layers for constituting the first and second inductors,
   the plurality of capacitor conductor layers include two capacitor conductor layers disposed at a same position in a stacking direction of the plurality of dielectric layers, and
   the two capacitor conductor layers are point symmetric to each other.

2. An LC circuit comprising:
   a first capacitor provided between a first connection point and a second connection point;
   a second capacitor provided between the second connection point and a third connection point;
   a third capacitor provided between the third connection point and a fourth connection point;
   a fourth capacitor having one end directly connected to the first connection point and another end directly connected to the third connection point;
   a fifth capacitor having one end directly connected to the second connection point and another end directly connected to the fourth connection point;
   a first inductor having one end connected to the second connection point, and another end connected to a ground, without any capacitor disposed between the first inductor and the ground; and
   a second inductor having one end connected to the third connection point, and another end connected to the ground, without any capacitor disposed between the second inductor and the ground.

3. The LC circuit according to claim 2, further comprising a third inductor provided between each of the first inductor and the second inductor and the ground.

4. The LC circuit according to claim 2, further comprising:
a sixth capacitor connected to the second connection point and connected in parallel to the first inductor; and
a seventh capacitor connected to the third connection point and connected in parallel to the second inductor.

5. The LC circuit according to claim 2, wherein
the first connection point is connected to a first signal port for signal inputting or outputting, and
the fourth connection point is connected to a second signal port for the signal inputting or outputting.

6. The LC circuit according to claim 5, wherein the first to fourth connection points are sequentially provided on a signal path connecting the first signal port and the second signal port.

7. The LC circuit according to claim 5, wherein another circuit is provided at least one of between the first connection point and the first signal port or between the fourth connection point and the second signal port.

8. The LC circuit according to claim 2, further comprising a stack for integrating the first to fifth capacitors and the first and second inductors, the stack including a plurality of dielectric layers and conductor layers that are stacked.

9. The LC circuit according to claim 8, wherein the plurality of conductor layers include a plurality of capacitor conductor layers for constituting the first to fifth capacitors and a plurality of inductor conductor layers for constituting the first and second inductors.

10. The LC circuit according to claim 9, wherein
the plurality of capacitor conductor layers include two capacitor conductor layers disposed at a same position in a stacking direction of the plurality of dielectric layers, and
the two capacitor conductor layers are point symmetric to each other.

11. The LC circuit according to claim 9, wherein
the plurality of inductor conductor layers include two inductor conductor layers disposed at a same position in a stacking direction of the plurality of dielectric layers, and
the two inductor conductor layers are point symmetric to each other.

12. An LC circuit comprising:
a first capacitor provided between a first connection point and a second connection point;
a second capacitor provided between the second connection point and a third connection point;
a third capacitor provided between the third connection point and a fourth connection point;
a fourth capacitor provided between the first connection point and the third connection point;
a fifth capacitor provided between the second connection point and the fourth connection point;
a first inductor connected to the second connection point;
a second inductor connected to the third connection point; and
a stack for integrating the first to fifth capacitors and the first and second inductors, the stack including a plurality of dielectric layers and conductor layers that are stacked,
wherein the plurality of conductor layers include a plurality of capacitor conductor layers for constituting the first to fifth capacitors and a plurality of inductor conductor layers for constituting the first and second inductors,
the plurality of capacitor conductor layers include two capacitor conductor layers disposed at a same position in a stacking direction of the plurality of dielectric layers, and
the two capacitor conductor layers are point symmetric to each other.

13. A filter comprising:
a first signal port and a second signal port each used for signal inputting or outputting;
a signal path that connects the first signal port and the second signal port and on which a first connection point, a second connection point, a third connection point, and a fourth connection point are sequentially provided;
a first capacitor provided between the second connection point and the third connection point;
a second capacitor having one end directly connected to the first connection point and another end directly connected to the third connection point;
a third capacitor having one end directly connected to the second connection point and another end directly connected to the fourth connection point;
a first inductor having one end connected to the second connection point, and another end connected to a ground, without any capacitor disposed between the first inductor and the ground; and
a second inductor having one end connected to the third connection point, and another end connected to the ground, without any capacitor disposed between the second inductor and the ground.

14. The filter according to claim 13, further comprising a third inductor provided between each of the first inductor and the second inductor and the ground.

15. The filter according to claim 13, further comprising:
a fourth capacitor provided between the first connection point and the second connection point; and
a fifth capacitor provided between the third connection point and the fourth connection point.

16. The filter according to claim 15, wherein the first to fifth capacitors and the first and second inductors constitute a high-pass filter.

17. The filter according to claim 15, wherein another circuit is provided at least one of between the first connection point and the first signal port or between the fourth connection point and the second signal port.

18. The filter according to claim 17, wherein
the first to fifth capacitors and the first and second inductors constitute a high-pass filter, and
another circuit is a low-pass filter.

19. The filter according to claim 13, further comprising:
a sixth capacitor connected to the second connection point and connected in parallel to the first inductor; and
a seventh capacitor connected to the third connection point and connected in parallel to the second inductor.

20. The filter according to claim 13, further comprising a stack for integrating the first to third capacitors and the first and second inductors, the stack including a plurality of dielectric layers and conductor layers that are stacked.

21. The filter according to claim 20, wherein the plurality of conductor layers include a plurality of capacitor conductor layers for constituting the first to third capacitors and a plurality of inductor conductor layers for constituting the first and second inductors.

22. The filter according to claim 21, wherein
- the plurality of capacitor conductor layers include two capacitor conductor layers disposed at a same position in a stacking direction of the plurality of dielectric layers, and
- the two capacitor conductor layers are point symmetric to each other.

23. The filter according to claim 21, wherein
- the plurality of inductor conductor layers include two inductor conductor layers disposed at a same position in a stacking direction of the plurality of dielectric layers, and
- the two inductor conductor layers are point symmetric to each other.

* * * * *